United States Patent [19]

Van Gils

[11] Patent Number: 4,727,546
[45] Date of Patent: Feb. 23, 1988

[54] DATA PROCESSING SYSTEM COMPOSED OF THREE DATA PROCESSING MODULES

[75] Inventor: Willibrordus J. Van Gils, Eindhoven, Netherlands

[73] Assignee: U.S. Philips Corporation, New York, N.Y.

[21] Appl. No.: 786,773

[22] Filed: Oct. 11, 1985

[30] Foreign Application Priority Data

Oct. 16, 1984 [NL] Netherlands .................. 8403147

[51] Int. Cl.$^4$ .......................................... G06F 11/10
[52] U.S. Cl. .................................................. 371/37
[58] Field of Search ................. 371/37, 39, 43, 44, 371/38

[56] References Cited

U.S. PATENT DOCUMENTS

| | | | |
|---|---|---|---|
| 4,030,067 | 6/1977 | Howell | 371/37 |
| 4,117,458 | 9/1978 | Burghard | 371/37 |
| 4,165,444 | 8/1979 | Gordon | 371/37 X |
| 4,512,020 | 4/1985 | Krol | 371/37 |

OTHER PUBLICATIONS

W. W. Peterson & E. J. Weldon, "Error-Correcting Codes", 1972, pp. 121–123.

*Primary Examiner*—Jerry Smith
*Assistant Examiner*—Robert W. Beausoliel, Jr.
*Attorney, Agent, or Firm*—Jack E. Haken; James J. Cannon

[57] ABSTRACT

A data processing system is composed of three data processing modules each of which comprises mutually corresponding processing means. The results are applied to all other data processing modules via an interconnection network. For the interconnection an encoder is connected in at least two data processing modules. Encoding envolves the multiplication of the multibit quantities received by respective, regular matrices which differ from the identity matrix as well as from one another. By a suitable choice of these matrices, one code symbol or two bit errors in different code symbols can be corrected for a width of 4 bits. In an erasure mode one further bit error is correctable outside the ignored symbol. For larger values of k, the maximum error protection capability can be increased further.

6 Claims, 8 Drawing Figures

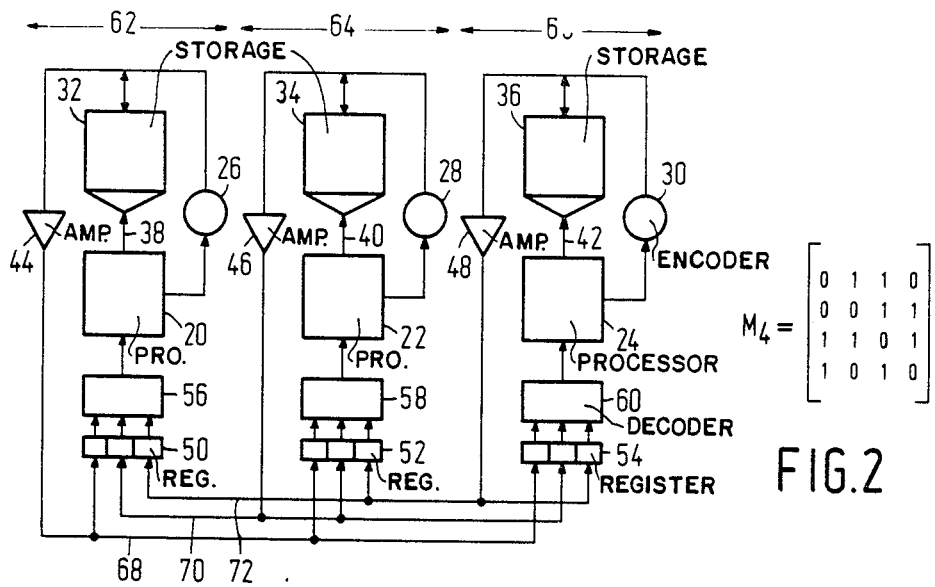

4,727,546

DATA PROCESSING SYSTEM COMPOSED OF THREE DATA PROCESSING MODULES

BACKGROUND OF THE INVENTION

The invention relates to a data processing system which is composed of three data processing modules which include mutually corresponding processing means and storage modules which are connected thereto, which data processing system includes an interconnection network which is connected to first outputs of the data processing modules in order to apply multi-bit processing results of $k \geq 4$ bits each from any data processing module to the other data processing modules, each data processing module including an input decoder which is connected to the interconnection network and which includes a second output which is connected to the local processing means in order to reconstruct a correct k-bit input word from mutually incongruent processing results even in the case of failure of one data processing module. Using a triplication operation, a majority decision can be taken on the basis of the processing results. Congruent is to be understood to mean herein that the respective processing results in the non-disturbed state represent the same information. The data processing system can thus continue to operate correctly even when one of the data processing modules becomes defective and outputs unreliable information.

It is known that such data processing modules usually exhibit a mutually independent failure behavior. When one module fails, the other two modules can detect the faulty module and ignore it on the basis of a majority decision. The generator matrix of the error protection code used in the known system can be written as:

$$G = (III), \qquad (1)$$

in which (I) is the identity matrix of dimension $k \times k$ (k is the number of bits of the information from each module). The invention is based on the idea that additional error protection can be achieved by the described degree of redundancy.

SUMMARY OF THE INVENTION

This object is achieved in accordance with the invention in that at least two of said data processing modules include, connected in the chain between said second output and said first output, encoder modules for multiplying a k-bit quantity received therein by regular matrices which differ from one another and from the identify matrix, possibly while performing also a multiplication of all correponding k-bit quantities by the same regular matrix and internal permutation of the elements of any such k-bit quantity by multiplication by a permutation matrix (Q), in order to obtain three code symbols, the decoders including reconverters for the operations introduced by the encoders, there being provided a mode register for controlling, in addition to a normal mode in which one disturbed code symbol can be corrected, the correction of all bit errors up to and including two bits in different code symbols, and also for controlling in three different erasure modes, in addition to the ignoring of one associated code symbol, the correction of one arbitrary bit error outside the ignored code symbol. This can be expressed in the form of a formula as follows:

$$(G) = (P)(IAB)(Q)$$

in which (A), (B), and (P) are regular matrices while (Q) is a permutation matrix; the latter matrix includes three rows and three columns of partial permutation matrices, each row and each column containing exactly one non zero partial permutation matrix. Each partial permutation matrix acts on one symbol, so that each column and each row thereof contains one bit having the value 1. (Q) may be an identity matrix.

The invention is based on the idea that, in addition to completely defective data processing modules, many single-bit errors also occur, for example due to cosmic radiation particles which strike a memory. It is an object of the invention to render such bit errors correctable or detectable on the basis of the triplication redundancy without using additional components, while ensuring at the same time that even complete failure of a data processing module cannot disturb the procedure.

It has been found that when the matrix $(G) = (1 a^p a^q)$ is chosen a simple relationship between p and q represents an adequate and necessary condition for the foregoing, that is to say p, q and p-q $\in \overline{W}_1$, in which $\overline{W}_1$ is the complement of the set $W_1$:

$$W_1 := \gamma i - j \mid i, j \in V_1\}, \quad V_1 := \{i \mid wt(a^i) = 1\},$$

while wt denotes the weight of the symbol $a^i$ which is represented with respect to a base of this Galois field formed on a primitive polynomial.

Preferably, for $k = 8$ the mode register controls the correction of all bit errors up to a maximum of three bits in different code symbols in the normal mode and controls each time the correction of all bit errors up to a maximum of two random bit errors outside the ignored code symbol in an erasure mode. Elaborating upon the foregoing, a more extensive protection can also be provided for larger Galois fields.

Attractive further embodiments of the invention are described in the dependent Claims.

BRIEF DESCRIPTION OF THE FIGURES

The invention will be described in detail hereinafter with reference to some Figures. First the data processing system as a whole will be briefly described. Subsequently, some properties of the code will be described; finally, decoders will be presented for the cases $k = 4, 8, 16$.

FIG. 1 shows a data processing system in which the invention can be implemented;
FIG. 2 shows an example of a matrix M for $k = 4$;
FIG. 3 shows an example of a matrix M for $k = 8$;
FIG. 4 shows an example of a matrix M for $k = 16$.

Figure 5:
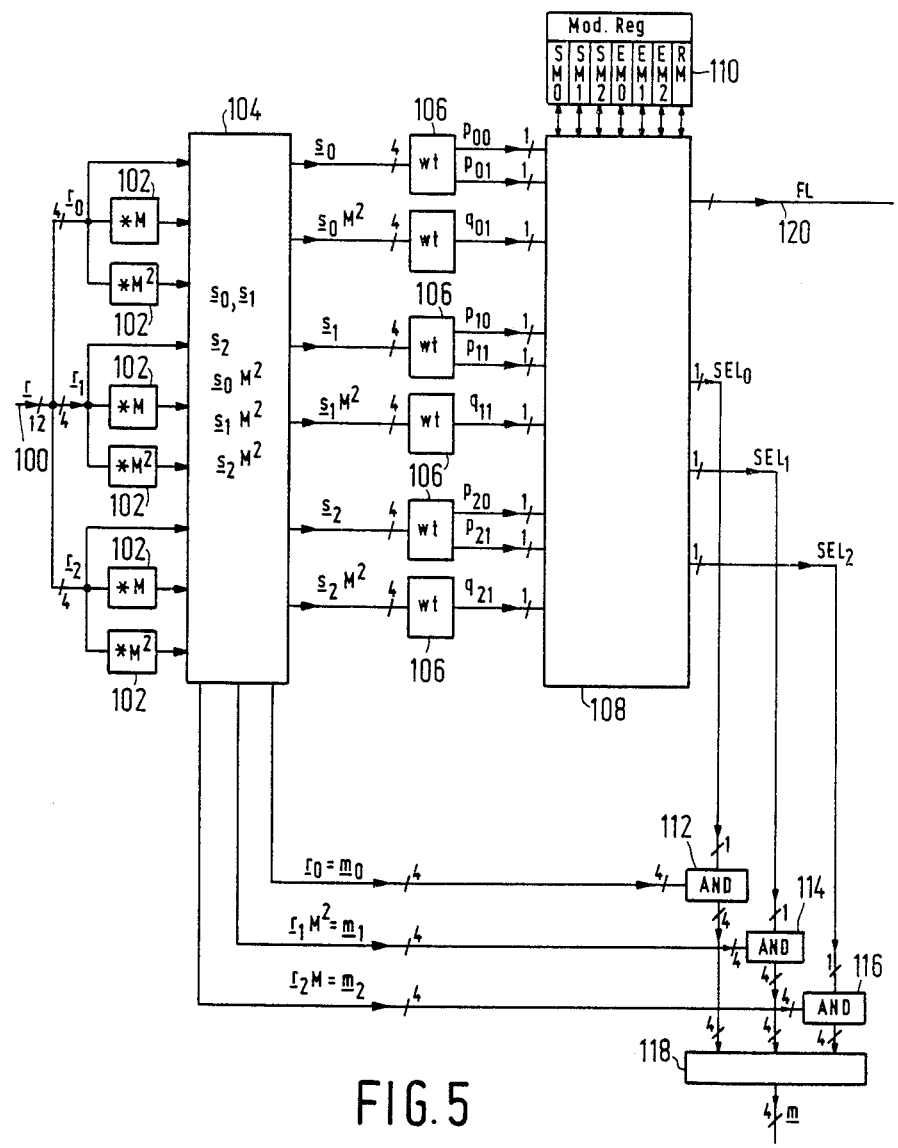
FIG. 5 shows a decoder for $k = 4$.

Table 5 contains some logic equations for a decoder for GF($2^4$);

Table 6 contains the gating pattern for the erasure mode for GF($2^8$);

Table 7 contains some logic functions for controlling the decoder for GF($2^8$);

Table 8 contains correctable and detectable error patterns in GF($2^{16}$) with some properties;

Table 8a is a continuation thereof;

Table 9 contains the same for the erasure modes;

Table 10 contains a logic expression P for GF($2^{16}$);

Table 11 contains some logic functions for controlling the decoder for GF($2^{16}$).

DESCRIPTION OF THE PREFERRED EMBODIMENT

Example of a Data Processing System

FIG. 1 shows a data processing system in which the invention can be implemented. There are provided three data processing modules 62, 64, 66 which are composed of corresponding blocks as shown in the Figure; the differences between the modules are embodied in the encoder modules 26, 28, 30. The first data processing module includes a processor module 20; this module is capable of processing an input word, for example in a conventional manner. The nature of the operations is determined by the intended use of the system. The respective processor modules execute the same program. The processor module 20 outputs addresses for a storage module 32 on line 38. Data are presented to the encoder module 26. The function of the latter module will be described in detail hereinafter. The output of the encoder module 26 is connected to the data connection of the storage module 32. The encoder module 26 and the storage module 32 are both connected to an output amplifier 44 which serves to feed an interconnection network (68, 70, 72). The interconnection network is connected to registers 50, 52, 54 in respective data processing modules, so that the information required for decoding is present simultaneously. The processing results of the three modules are decoded in decoders 56, 58, 60 and, of necessary and feasible, corrected in order to reconstruct the input word for the processor modules. The decoders are identical. The synchronization of the data processing modules with respect to one another has been omitted for the sake of simplicity; it is critical only as regards the registers 50, 52, 54. Connections to the environment have also been omitted. These connections may be singular and be connected to all modules 62, 64, 66; they may alternatively be implemented in a redundant manner, for example in triplicate. The processor modules may have a complex or simple construction; it may even be that each data processing module only has mainly a storage function. The output of the encoder module 26 need not be directly connected to the interconnection network; a storage function may always be inserted. Further components may also be included in each data processing module, but the essentials are shown in the Figure. As will be explained hereinafter, the circuit may be modified. For example, in one of the data processing modules the encoder may be omitted. The algorithms to be implemented by the respective encoders must satisfy given requirements as will be explained hereinafter. Part of this algorithm may also be mapped on the decoders; in that case the decoders need not necessarily be identical. A simple example consists in that the first two data processing modules process the same data while the last data processing module processes the bit-wise inverted value thereof. Other internal transformations may also be advantageous in some cases. The respective encoders may also be connected directly to the outputs of the decoders; in that case, however, the processor modules must execute different operations. The encoder modules may also be combined with the associated amplifier (44, 46, 48).

General Description of the Code

Each data processing module processes an input word which is called a k-bit symbol in error protection code literature. In the embodiments a symbol has 4, 8 or 16 bits, but the code is not restricted thereto. Each of the input decoders processes a code word consisting of three symbols. Each of the encoders forms one code symbol and together they form one code word. The generator matrix can be written as:

$$G = (M0 \ M1 \ M2),$$

in which Mi (i=0 ... 2) is a regular matrix of k×k bits. Each of the three sub-matrices may be multiplied by an arbitrary permutation matrix in order to map the code bits within the relevant symbol on other code bits. This will not be elaborated upon for the sake of simplicity. First the code will be considered as a (3, 1) code over the Galois-field GF($2^k$), in which k=4, 8, 16. The theory of these fields is extensively dealt with in the book "The theory of error-correcting codes" by F. J. MacWilliams and N. J. A. Sloane, Amsterdam 1977. The code thus contains three symbols and the data content of one symbol: (3, 1). The weight of a symbol is defined as the number of "1" bits contained in the relevant symbol. The weight of a series of symbols (vector) is the sum of the weights of the symbols. The weight profile of a vector is a series of numbers. The first number is the weight of the complete vector, for the next number the "heaviest" symbol omitted and the weight is determined for the remaining vector, and so on. In a linear code the weight of a code word always at least equals the minimum distance of the code when the all-zero vector is ignored. There is always at least one code word for which the correspondence situation occurs. The minimum distance profile of a linear code consists of a number of elements having a value equal to the lowest value of the corresponding element of the weight profile of any code word of the code. The zero vector is then ignored again.

A pair (s, t) is defined as a "description" of a word if s symbols thereof which differ from zero can be omitted, so that the weight of the remainder of the word is equal to t. The "description set" is the set of all descriptions of a word. A set of pairs of natural numbers ($a_i$, $b_i$) is referred to as a "list" if all numbers $a_i$ differ from one another. A code word is "covered" by the set of pairs if for at least one description (s, t) there exists a pair ($a_i$, $b_i$) so that $a_i \geq s$, $b_i \geq t$. Subsequently, T, U are assumed to be two lists of pairs. The code C corrects T errors (maximum) and at the same time detects U errors (maximum) if all errors covered by T are corrected and all errors which are covered by U but not by T are detected. This means that the difference between a first vector t, covered by T, and the second vector u, covered by T or U, is never a code word. It holds good that the above code C has the described error-protecting properties exclusively if for each pair (s, t) in T and each pair (u, v) in the union of T and U the $(s+u)^{th}$ component of the minimum distance profile is at least equal to $t+v+1$. The minimum symbol distance of the code is the minimum number of symbols differing from zero in any code word differing from zero. When e symbols are ignored as erasure symbols in a code word, it holds good for the (n-e) components of the minimum distance profile of the new code that they are at least equal to the corresponding components of the (n-e) last components of the minimum distance profile of the original code.

The Determination of a Base

If $P(x)$ in the Galois field $GF(2)(x)$ is a primitive polynomial of the degree k having a zero point "a", "a" will be a primitive element of the Galois field $GF(2^k)$ containing: $0, 1, a, a^2 \ldots a^{2k-2}$. A number of k elements then form a base $(a^{b(0)}, a^{b(1)}, a^{b(2)} \ldots a^{b(k-1)})$ thereof if a non-trivial solution exists for:

$$\sum_{i=0}^{k-1} f_i a^{b(i)} = 0, \text{ where } f_i = 0 \text{ or } 1.$$

The trivial solution is the zero solution; the i now represents a sequence number. Each element of the revelant Galois field can be expressed in the base elements thereof; the number $f_i$ having the value "1" is the weight of the relevant element with respect to the base in question. The base $1, a \ldots a^{k-1}$ is the polynomial base. If for any value of j a base is formed by $a^j, a^{j \cdot 2}, a^{j \cdot 2^2} \ldots a^{j \cdot 2^{k-1}}$, this will be a normal base. For $GF(2^4)$ with the primitive polynomial $x^4+x+1$, the table 1 contains the elements relating to the polynomial base at the left and subsequently with respect to the normal base: $a^3, a^6, a^{12}, a^{24}=a^9$, each time the associated weights also being stated.

The Formation of the Codes

For the already described base $(a^{b(0)}, a^{b(1)}, a^{b(2)} \ldots a^{b(k-1)})$, the following can be defined:

$$h=a^{(2^k-1)/3}$$

in which h is a primitive element of $GF(2^2)$: $(0, 1, h, h^2)$. Subsequently, the (3, 1) code C having a length 3 and a dimension 1 over $GF(2^k)$, with the generator matrix $$G=(1 \; h \; h^2)$$

is mapped on a binary (3k, k) code having a length 3k and a dimension k. (h is a k-tuple of bits). This mapping operation is performed by way of the vector representation of $GF(2^k)$ with respect to the previously described base. The generator matrix of the binary code is:

$$G^*=(I \; M \; M^2).$$

Therein, I is the identity matrix (that is not a restriction). M is a matrix in which the $i^{th}$ row is formed by the binary representation of $h \cdot a^{b(i)}$ in relation to the already described base. For $k=4, p(x)=x^4+x+1$ is one of the two primitive polynomials; therefor, there are two normal bases, i.e.
$(a^3, a^6, a^{12}, a^9)$
$(a^7, a^{14}, a^{13}, a^{11})$; h is always $a^5$.

The code having the generator matrix $G=(1h \; h^2)=(1a^5 a^{10})$ has a minimum distance profile (6, 3, 1) with respect to the polynomial base and the two normal bases. Table 2 shows the messages $a^j$ in $GF(2^4)$ with a list of properties thereof, that is to say the weights of the symbols ($c_0 \ldots c_2$) formed by means of the encoder, and the weight profile, all data being given in respect of the polynomial base. The error protection characteristic of this code is (1, 0) (0, 2): one symbol can be corrected and alternatively two arbitrary bit positions. When one symbol of each code word is ignored, a (2, 1) code is obtained having a minimum distance profile (3, 1). This code has a correction capability (0, 1) in relation to the polynomial base. FIG. 2 shows the relevant example of the generator (sub)-matrix M. The code can be modified by using a different primitive polynomial. The value of h can be chosen to be different and so can the exponents of the sub-matrix M. In various cases attractive codes will then be found. The extensively described code, however, is at the most equalled but not surpassed as regards error protection capability.

For $k=8, p(x)=x^8+x^4+x^3+x^2+1$ represents one of the series of primitive polynomials; let a be a zero point of this polynomial. This Galois field has sixteen normal bases, each of which can be symbolized by one element $a^i$; the other elements can be directly derived therefrom: the base will be indicated hereinafter by the exponent i of $a^i$. The generator matrix of the code then becomes:

$$G=(1h \; h^2)=(1a^{85}a^{170})$$

when the symbol element $h=a^{85}$ is chosen. This code has a minimum distance profile of (8, 4, 1) in relation to the normal base having the exponent values 9, 21, 39, 43, 55, 61, 91, 95 and a distance profile (8, 5, 1) in relation to the normal base having the exponent values 5, 11, 15, 29, 47, 53, 63, 87. FIG. 3 shows an example of the sub-matrix M in relation to the normal matrix where $i=5$. The minimum distance profile of this code is (8, 5, 1). This means that this code has at the same time a (1, 0) (0, 3) correction capability and a (0, 4) detection capability; thus, there are correction possibilities for either a complete symbol or up to and including three bit errors. Moreover, four bit errors can be detected. When one symbol is ignored (erasure mode), a (2, 1) code is obtained over the Galois field $FD(2^8)$ with a minimum distance profile (5, 1). This means a correction capability with respect to the normal base having the exponent value 5 of (0, 2): two random bits outside the ignored symbol can then be corrected as yet.

In the case $k=16$, there are even more different primitive polynomials, for example $(x^{16}+x^{12}+x^3+x+1)$. When 1 is a root of this equation, it can be assumed: $h=a \text{ (exp 21845)}$. We now take the (3, 1) code with the generator matrix $$G=(1h \; h^2)=(1a \text{ exp } 21845 a \text{ exp } 43690).$$

This code has a minimum distance profile (12, 7, 1) in respect of the normal base $N15=(a^{15}, a^{30}, a^{60}, a^{120} \ldots)$. An example of the sub-matrix M is given in FIG. 4. In relation to the base given this code has at the same time a correction capability of (1, 0) (0, 5) and a detection capability of (0, 6); thus, there are correction possibilities for either one complete symbol or up to and including five bit errors. Moreover, six bit errors can be detected. When one symbol is ignored in an erasure mode, a (2, 1) code will be obtained over the Galois field $GF(2^{16})$ with a minimum distance profile (7, 1). This means a correction capability with respect to said normal base of (0, 3): three random bits outside the ignored symbol can then be corrected as yet. Table 3 contains a number of normal bases for this Galois field, together with the minimum distance profile of this code with respect to the relevant normal base; Nj is given by (a$^j$, a$^{2j}$, a$^{4j}$, a$^{8j}$ ... ). It is to be noted that no codes have been found which surpass the described codes as regards protection capability. Only the first two elements of the profile are given; the third element always has the value "1".

General description of the algorithm for constructing (3, 1) codes over the field GF(2$^k$).

1. Choose a primitive polynomial p(x) for GF(2$^k$) and let Q be a zero point of this polynomial p(x)

$$GF(2^k) = 0, 1, a, a^2, \ldots, a^{2^k-2}$$

2. Choose a base a$^{b(0)}$, a$^{b(1)}$, ..., a$^{b(k-1)}$ for this field.

$$\sum_{j=0}^{k-1} x_{ij} a^{b(j)}$$

is the representation of a$^i$ with respect to the base a$^{b(0)}$, a$^{b(1)}$, ..., a$^{b(k-1)}$, which means $$a^i = \sum_{j=0}^{k-1} x_{ij} a^{b(j)},$$

the weights wt(a$^i$) is defined as the number of components $x_{ij}$, j=0, ..., k−1, equal to 1: $wt(a^i) = \#\{j | x_{ij} = 1\}$.

3. Define the following sets $$V_x = \{i | wt(a^i) = x\}$$

$$W_x = \{i-j | i,j \in V_x\}$$

$$W_{xy} = \{i-j | i \in V_x, j \in V_y\} \cup \{i-j | i \in V_y, j \in V_x\}$$

$$Y_i^\mu = \{j - i | j \in V_u\}$$

The complement $\overline{U}$ of a set U, sub-set of {0, 1, ... 2$^k$-2}, with respect to {0, 1, ..., 2$^k$-2} is defined as $\overline{U}$: = {0, 1, ..., 2$^k$-2}/

4. Define the following conditions
A: p, q, p−q ∈ $\overline{W}_1$
B: p, q, p−q ∈ $\overline{W}_{12}$
C: ∀ v ∈ V$_2$[p ∈ $\overline{Y_v^2}$ or q ∈ $\overline{Y_v^2}$]
D: p, q, p−q ∈ $\overline{W}_{13} \cap \overline{W}_2$
E: ∀ r ∈ V$_3$[p ∈ $\overline{Y_r^3}$ or q ∈ $\overline{Y_r^2}$]
and ∀ r ∈ V$_c$[p ∈ $\overline{Y_r^2}$ or q ∈ $\overline{Y_r^3}$]
and ∀ v ∈ V$_2$[p ∈ $\overline{Y_v^3}$ or q ∈ $\overline{Y_v^3}$]

5. The (3, 1) code with the generator matrix (i a$^p$a$^q$) has a minimum distance profile mdp with respect to the base a$^{b(0)}$, a$^{b(1)}$, ..., a$^{b(k-1)}$ which satisfies
mdp ≥ (5, 3, 1) ←→ A
mdp ≥ (6, 4, 1) ←→ A and B
mdp ≥ (7, 4, 1) ←→ A, B and C
mdp ≥ (8, 5, 1) ←→ A, B, C and D
mdp ≥ (9, 5, 1) ←→ A, B, C, D and E.

A sequence of conditions can thus be drafted for a given Galois field, where the previously given codes for CF(2$^4$), GF(2$^8$) and GF(2$^{16}$) have the maximum protection capability for the relevant Galois field.

General Description of the Decoding

Hereinafter the common properties of the three decoders will first be described. For the parity check matrix for the generator matrix G=(I M M$^2$) can be chosen:

$$H^* = \begin{pmatrix} O & M^T & I \\ I & O & M^T \end{pmatrix},$$

which is extended for the decoding with a third, redundant line (M$^T$ I O) in order to form the transposed matrix H$^T$. The syndromes are formed by multiplication by the matrix H$^T$ $$H^T = \begin{pmatrix} O & I & M \\ M & O & I \\ I & M & O \end{pmatrix},$$

so the syndrome $s = rH^T = (r_1M + r_2, r_0 + r_2M, r_0M + r_1)$, in which $r_0$, $r_1$, $r_2$ are symbols of the disturbed code word. All error patterns of a set U can now be corrected if the sum of any two patterns thereof does not form a new non-disturbed code word.

Furthermore, it is the intention that, when a data processing module is completely defective, it is completely ignored and that further bit errors are correctable in that case. Without imposing a restriction, it is assumed that the code symbol $r_0$ is ignored. For the remaining non-disturbed code symbols $c_1$, $c_2$ it must then hold good that:

$$(c_1, c_2) \begin{pmatrix} M \\ I \end{pmatrix} = 0.$$

If this code has a minimum Hamming distance (2t+1), t random bit errors can be corrected outside the ignored module.

Table 4 shows a number of properties of the syndromes for the occurrence of different error categories. Within one error category the syndrome each time have one property in common, so that the relevant error category can be detected on the basis thereof. The first column contains the error category, so the distribution pattern of the bit errors over the code symbols. All cases up to five disturbed bits will be successively considered, and after that only those cases where disturbed bits occur each time in two different symbols (when only one symbol is disturbed, the conventional triplication majority decision is effective). Each number in the further columns indicates a "weight". The $u_i$ columns contain the weight of the i$^{th}$ component of the syndrome in as far as it is caused by the disturbance: s(e). The $v_i$ columns contain the weight of the i$^{th}$ component of s(e)$_i$M$^2$. These are the same for all patterns in this error category. The numbers not shown (for example, first line $u_0$) will not be considered. The weight of a component is the number of bits having the value "1". For the error possibilities not shown it also holds good that: if there are no errors, u0 = u1 = u2 = 0. When there is an error in one symbol, it holds good that the corresponding quantity $u_i$ has the value zero, but that the other two quantities $u_j$ deviate from zero. The information of the various lines of table 4 is unique so that, when the code indeed has the correction capability required for a given line of the table, each time the one correct symbol is indicated, so that it can be made available to a user without a further correction operation being required.

It is apparent that a matrix M can be found so that in the case k=4 an (8, 4) code remains with a minimum distance 3 (one bit correctable) when one symbol is ignored. On the other hand, all random pairs of incorrect bits can be corrected.

In the case k=8 it is apparent that a matrix can be found whereby all bit error patterns shown up to and including 3 can be corrected; moreover the bit patterns "4" can be detected. When one module is ignored, a (16, 8) code remains with a minimum distance "5", so that two errors remain correctable.

For the case k=16, it is apparent that a matrix M can be found whereby all bit error patterns shown up to and including 5 can be corrected; moreover, cases involving 6 bit errors can then be detected. When one module is completely ignored, a (32, 16) code remains with a minimum distance "7", so that three bit errors can be corrected. The matrices are shown by way of example in the FIGS. 2-4; however, many other matrices exist which have at the most the same error protection capability which, however, is always greater than that which can be achieved by mere triplication of the data processing modules.

Some general signal definitions will now be given:

$p_{ij}=1$ only if $u_i=j$.

$q_{ij}=1$ only if $v_i=j$.

$m_0$, $m_1$, $m_2$ are defined as $r_0$, $r_1M^2$, $r_2M$, respectively. The quantities $r_0$, $r_1$, $r_2$ are the symbols of the code word received (all symbols are treated here as row vectors). RW=1 means that the decoder operates in the normal or "random" mode, in which in principle all code symbols can make a contribution for the decoding operation; EMi means that the decoder ignores the symbol $r_i$ (erasure mode), SMi means that the decoder treats only the symbol $r_i$, so that redundancy is no longer present.

Description of a Decoder for k=4

FIG. 5 shows a preferred embodiment of a decoder for k=4. It will be apparent that the implementation of the code can also be realized in a different manner. The code words arrive on the input 100 with a width of 12 bits; all symbols are allowed to pass in unmodified form or are multiplied by the sub-matrices M and $M^2$ in the multiplier elements 102.

Element 104 receives the code word and the multiplication results and forms the syndrome symbols $s_0$, $s_1$, $s_2$, $s_0M^2$, $s_1M^2$ and $s_2M^2$ therefrom by addition operations and multiplication by the sub-matrix $M^2$. Furthermore, the element 104 acts as a distribution circuit which comprises nine outputs for the quantities indicated. The weight determining devices 106 determine each time the weight of the quantity applied thereto and output a signal which represents the relevant weight value. For a weight 0, there is one possibility, while for a weight 1 four possibilities exist. The symbols can act as an address and the output quantity as data. The weight determining devices can be used in a multiplex organization for the successive determination of a number of weights for the same code word.

Element 108 is a decision device which receives the respective weight values and whose functions is controlled by the mode register 110. The mode register controls the seven feasible modes of operation as indicated. Therefore, it comprises at least three bit positions, but storage of the decision bits in decoded form is easier. The gate circuits 112, 114, 116 receive a 1-bit selection signal from the decision device 108 and the three reconstructed versions of the data symbol, $r_0$, $r_1M^2$ and $r_2M$. The relevant version is either blocked or gated; in all correctable cases there is always at least one non-disturbed code symbol. The outputs of the three AND-gate circuits are bit-wise combined in an OR-function in element 118, so that a reconstructed data symbol can be represented on the output thereof which has a width of four bits.

First the gating pattern in the normal or random mode will be given:

p00=1, p10=1: no errors; conduct $m_0$
p00=1, p10=0: symbol $r_0$ incorrect; conduct $m_1$
p10=1, p20=0: symbol $r_1$ incorrect; conduct $m_2$
p20=1, p00=0: symbol $r_2$ incorrect; conduct $m_0$
p11=1, q01=1: bit errors in $r_0$, $r_1$; conduct $m_2$
p01=1, q21=1: bit errors in $r_0$, $r_2$; conduct $m_1$
p21=1, q11=1: bit errors in $r_1$, $r_2$; conduct $m_0$.

In the erasure mode the following gating pattern is produced:

EM0: p00=1/$m_1$; q01=1/$m_2$; p01=1/$m_1$.
EM1: p10=1/$m_2$; p11=1/$m_2$; q11=1/$m_0$.
EM2: p20=1/$m_0$; q21=1/$m_1$; p21=1/$m_0$.

(EMi means that the symbol i is ignored).

Furthermore, in the single-symbol modes SMi only the symbol i is used. The values of the gating control signals follow directly from the foregoing. Because of the described choices, only one gating control signal can be active at any time. When a code word arrives for which none of the gating control signals becomes active, the word will be uncorrectable and an error signal will be given on output 120.

The mode register is also updated. According to the strategy followed here a change-over is made to the next mode when the maximum error correction capability is reached. Originally, the system operates in the normal mode. When a symbol error occurs (more than one bit error in any symbol), a change-over is made to the erasure mode which ignores the relevant symbol. When a bit error occurs in the erasure mode, use will be made only of the (one) remaining correct symbol. The return to the normal mode can be realized, for example, by a control signal given by an operator. It will be apparent that other strategies are also feasible, for example in that more extensive use is made of the error history, but this is not indicated in this embodiment. Table 5 contains the respective logic equations. Furthermore, the synchronization has been omitted in the description, because synchronization itself can be realized in a conventional manner.

Description of a Decoder for k=8

Figure 6:
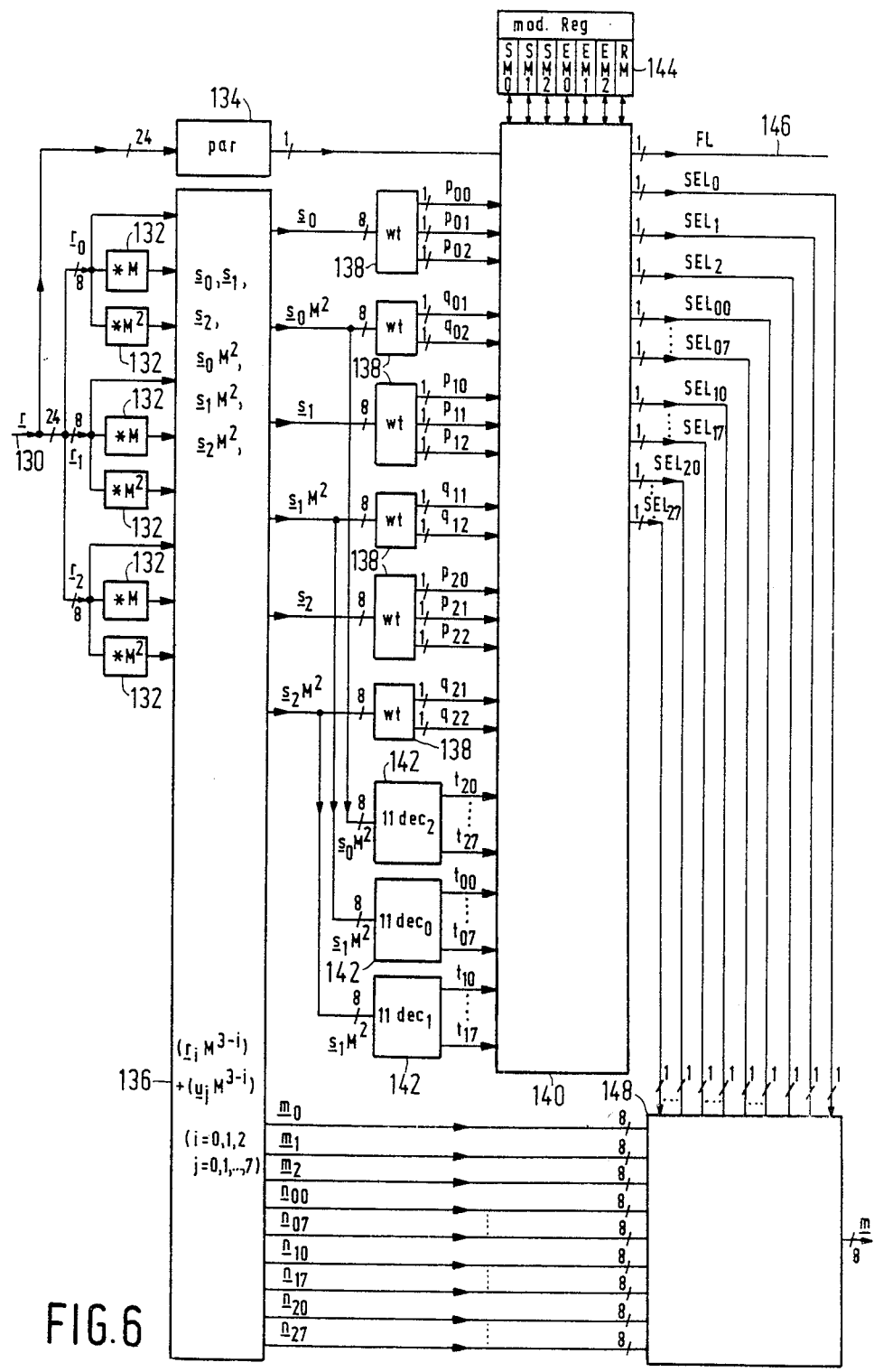
FIG. 6 shows a decoder for $k = 8$.

FIG. 6 shows an embodiment of a decoder for k=8. The code words arrive with a width of 24 bits on input 130. The symbols are conducted in unmodified form or are multiplied by the submatrices M and $M^2$ in the multiplier elements 132. Furthermore, the code word is applied in unmodified form to the generator 134 for the binary quantity "par" which equals the sum (modulo-2) of the number of code bits having the value 1.

Element 136 receives the code word and the multiplication results from the elements 132 and forms therefrom the syndrome symbols $s_0$, $s_1$, $s_2$, $s_0M^2$, $s_1M^2$, $s_2M^2$ by way of addition operations and multiplication by the sub-matrix $M^2$. Furthermore, therein twenty-four quantities $(r_i+u_j)M^{3-i}$ are determined for all values i(0 ... 2) and j(0 ... 7). Therein, $u_j$ is the $j^{th}$ unity vector containing a 1 in the $j^{th}$ position and for the remainder zeroes. Furthermore, the element 136 forms a distribution circuit which comprises 6+3+24=33 outputs for the quantities indicated. The weight determining devices 138 determine each time the weight of the quantity applied thereto and output a signal which represents the relevant weight value as given by the respective p, q quantities. As is indicated, fifteen output bits are to be generated.

Elements 142 are auxiliary decoders which will be described in detail hereinafter. Element 140 is a decision device which receives the respective weight values and the output signals of the auxiliary decoders and whose function is controlled by the mode register 144 whose construction is the same as that of the mode register 110 of FIG. 5. The decision device 140 outputs 27 selection signals and a detection signal on output 146. Block 148 is a gating unit for forming the data symbol to be conducted from the 54 signals received.

There will be defined a quantity R to be determined by the decision device:

$$\overline{R} = p_{00} + p_{10}\overline{p_{20}} + p_{20}\overline{p_{00}} + p_{11}q_{01} + p_{01}q_{21} + p_{21}q_{11} + p_{12}q_{01} + p_{11}q_{02} + p_{01}q_{22} + p_{02}q_{21} + p_{22}q_{11} + p_{21}q_{12}.$$

First of all, the normal mode will be described. If $\overline{\text{R.par}}$ has the value 1, there will be at least four bit errors in more than one symbol, which is indicated as an uncorrectable situation on output 146. For all correctable cases there will again be exclusive signalling by the respective weights. For symbol errors and error patterns involving at the most two bit errors, the gating pattern is the same as for the case k=4.

For three bit errors the gating pattern is as follows:
R par=1; all symbols one bit error, conduct $n_{1j}$
p12=801=1; bit error in $r_1$, 2 bit errors in $r_0$; conduct $m_2$
p11=q02=1; bit error in $r_0$, 2 bit errors in $r_1$; conduct $m_2$
p01=q22=1; bit error in $r_2$, 2 bit errors in $r_0$; conduct $m_1$
p02=q21=1; bit error in $r_0$, 2 bit errors in $r_2$, conduct $m_1$
p22=q11=1; bit error in $r_2$, 2 bit errors in $r_1$; conduct $m_0$
p21=q12=1; bit error in $r_1$, 2 bit errors in $r_2$; conduct $m_0$.

The symbol $n_{1j}=(r_1+u_j)M^2$, wherein j=0, ... 7; likewise $n_{2j}=(r_2+u_j)M^1$, and $n_{0j}=(r_0+u_j)M^3$; wherein $u_j$ is a unit vector with an i in position j (and for the remainder only zeroes). Actually, this is an estimation of the message $m_i$ to be corrected by a single-bit error in position j in $r_i$; due to this estimation, the relevant symbol is emulated as it were. In the erasure mode three auxiliary quantities are formed in the decision device:

$$\overline{T_i}=(p_{i0}+q_{i1}+p_{i1}+q_{i2}+p_{i2})$$

The gating pattern for the erasure mode is shown in Table 6. The first column contains the error configuration and the second column contains the logic expression which assumes the value "1" only for the relevant error configuration, so that the error configuration can be detected. The third column contains the quantity to be conducted. When all three code symbols contains a disturbance (three single-bit errors in the random mode or two single-bit errors and an erasure symbol in the erasure mode), only two code symbols will be considered in such a manner that they form a code word with a parity check matrix ($M^T$ I). Three single-bit errors produce R par=1 and in that case $c_0$, $c_1$ are taken and the decoder 11 dec 1; the other three cases are shown in Table 6.

Figure 7:
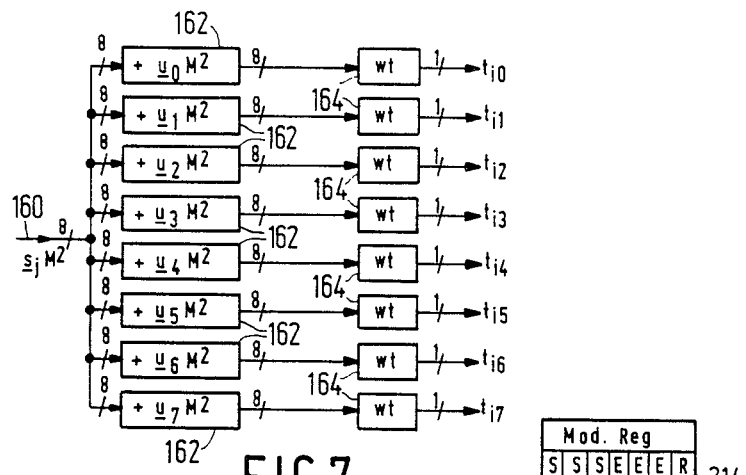
FIG. 7 shows an auxiliary decoder for use in conjunction with FIG. 6.

The error pattern is ($e_j$, $e_i$); both error symbols have a weight 1 with respect to the code with the parity check matrix ($M^T$I). The syndrome is: $S=e_jM+e_i$. A symbol u having the weight 1 must be found so that the weight of $(s+u)M^2=1$; this is the estimated error symbol and the estimated data symbol is then $(r_i+u)M^{3-i}$. The relevant decoders are constructed as shown in FIG. 7. The result from element 136 in FIG. 6 arrives on input 160. This result is added to $u_jM^2$ in 8 adder elements 162; in the elements 164 the weight $t_{ij}$ of each of the symbols found is determined. The output weight signals control the estimation of the relevant symbol $c_i$. Therefore, with $u_j$ there will be a vector containing a 1 in the $j^{th}$ position and for the remainder zeroes;
$t_{ij}=1$ if the decoder 11 $dec_i$ estimates the symbol m as being $(s_i+u_j)M^{3-i}=n_{ij}$.
If $EM_0T_0$ $t_{2j}=1$, $m=n_{2j}$.
If $EM_1T_1$ $t_{0j}=1$, $m=n_{0j}$.
If $(RM.R \text{ par}+EM_2T_2)t_{ij}=1$, $m=n_{1j}$.

The logic functions are given in Table 7. An error signal is formed if none of the selection signals becomes true. The change-over from the random mode to the erasure mode takes place in the same way as in the case k=4; the system changes over from the erasure mode to the single-symbol mode when two bit errors occur in the same code symbol.

Description of a Decoder for k=16

Figure 8:
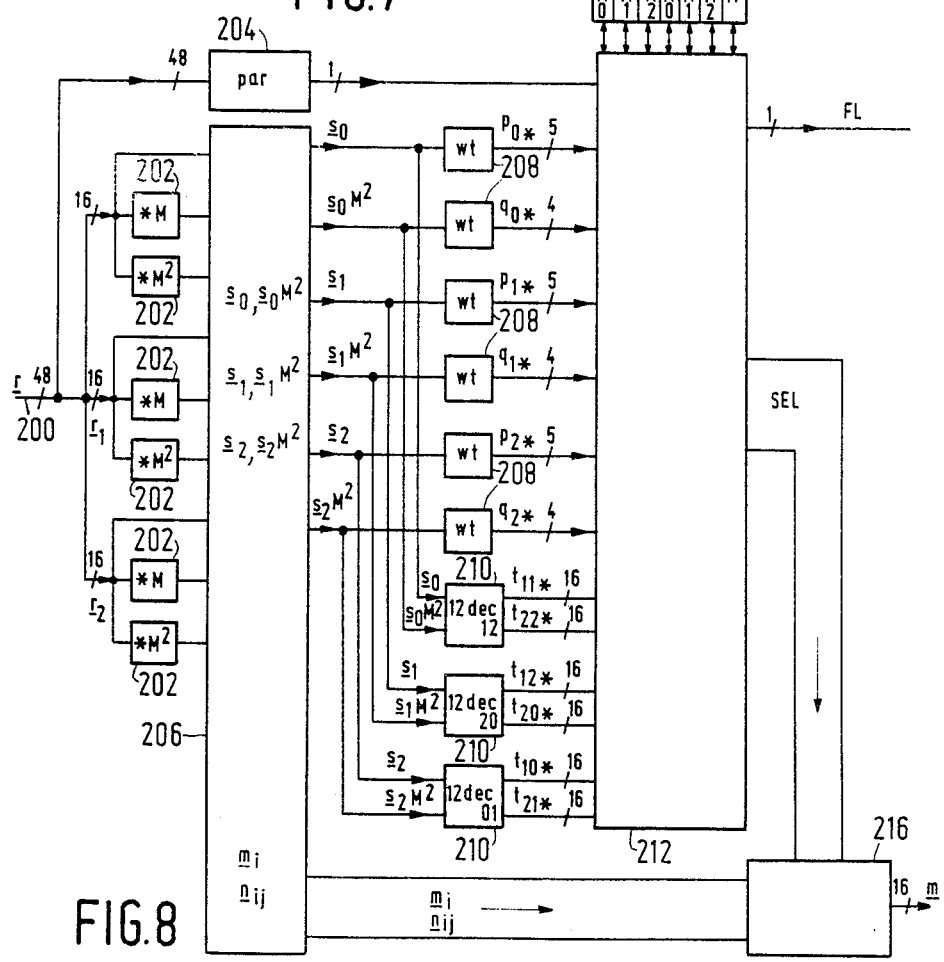
FIG. 8 shows a decoder for $k = 16$;
Table 1 contains the elements of a Galois-field $GF(2^4)$;
Table 2 contains the messages $a^j$ in $GF(2^4)$ with a list of properties of the associated code words;
Table 3 contains a number of normal bases and some properties for $GF(2^{16})$;
Table 4 contains a number of properties of error categories.

FIG. 8 shows an embodiment of a decoder for k=16. The code words arrive with a width of 48 bits on input 200. The respective symbols are conducted without modification or are multiplied by the sub-matrices M and $M^2$ in the multiplier elements 202. Furthermore, the code word is conducted without modification to the parity generator 204 which determines whether the number of "1" bits is even or odd. The operation of element 206 is substantially the same as that of the element 136 in FIG. 6; it receives the code word and the multiplication results from the elements 202 and forms the syndrome symbols by adding operations. Furthermore, therein forty-eight quantities $n_{ij}$ are determined for all values of i(0 ... 2) and j(0 ... 5). Furthermore, element 206 forms a distribution circuit comprising 6+3+48=57 outputs for the quantities as indicated. The weight-determining devices 208 each time determine the weight of a quantity applied thereto and output a signal which represents the relevant weight value as given by the p, q quantities. As is indicated, twenty-seven output bits are to be generated: each weight-determining device outputs no more than a single "1" bit on its outputs.

Elements 210 are auxiliary decoders whose operation corresponds substantially to that of the elements 142 in FIG. 6 which are detailed in FIG. 7. Some of the differences consist in that the auxiliary decoders now receive two 16-bit quantities and emulate an error pattern for two signals at the same time; auxiliary decoder 12 dec 12 thus serves for the symbols $r_1$ and $r_2$. Therefore, they comprise outputs having a width of 32 bits. Element 212 is a decision device which receives the respective weight values and the output signals from the auxiliary decoders and whose function is controlled by the mode register 214 which is constructed in the same way as the mode register 144 of FIG. 6. Block 216 is a gating unit for forming the data symbol to be conducted from the 51 SEL(ection) signals, the 48 $n_{ij}$ symbols and the 3 $m_i$ symbols. There is defined a quantity P which is to be determined by the decision device and which is formulated in Table 10. When a correctable error pattern is present for which P has the value "1", all three code symbols will exhibit a disturbance which is not equal to 0. In other cases, therefore, a non-disturbed symbol can be used for finding the correct result. When P=1, the error value in one symbol must be determined; in relation to the parity check matrix ($M^TI$), the weight sum of the errors then amounts to at least two and at the most three in the best two (least-disturbed) code symbols. The syndrome for these errors is: s: $=e_jM+e_i$. In the auxiliary decoders it is now attempted to find $e_j$ by emulating the sixteen symbols u having the weight "1" for $e_j$ and by checking whether the weight of (s+uM) then indeed equals 1 or 2. The emulation is also performed for the reverse combination. This produces the 32 output signals of each of the auxiliary decoders as follows: if a 16-bit vector u having the weight 1 can be found so that the weight of (s+uM)=1 or 2, $m=(r_j+u)M^{3-j}$; if a 16-bit vector v having the weight 1 can be found so that the weight of ($sM^2+vM^2$)=1 or 2, $m=(r_i+v)M^{3-i}$; these estimations of $m=n_{ij}$ are made available by the element 206.

Two quantities $A_{1i}$ and $A_{2i}$ and one quantity $B_i$ will now be defined: $A_{1i}$ (the sum over j of $t_{1ij}$)=1 if the auxiliary decoder 12 dec(i.) estimates the error pattern $e_i$ to have the weight 1. $A_{2i}$ (the sum over j of $t_{2ij}$)=1 if the auxiliary decoder 12 dec(.i) estimates the error pattern $e_i$ to have the weight 1. $B_i$ (the sum over j of $t_{1ij}\cdot t_{2ij}$)=1 if both auxiliary decoders 12 dec (i.) and 12 dec(.i) estimate the error pattern $e_i$ by the same symbol with the weight 1. Tables 8, 8a contain the various error patterns which can be corrected and detected in the normal or random mode. The first column contains the error configuration. The second column contains the adequate and necessary logic expression which obtains the value 1 for the detection of the relevant configuration. The third column contains the estimation for the message. In this respect the last line contains the condition for the detection of a non-correctable error configuration (this condition is sufficient, but is not suitable for detecting all error configurations).

For the erasure mode the following three quantities are defined:

$\overline{T}_0$: =(p00+p01+p02+p03+q01+q02+q03)
$\overline{T}_1$: =(p10+p11+p12+p13+q11+q12+q13)
$\overline{T}_2$: =(p20+p21+p22+p23+q21+q22+q23)

Table 9 contains the correctable and detectable patterns for the erasure modes in the same way as the Tables 8, 8a for the random mode. Table 11 corresponds to Table 7 in this case. The mode register is also switched over to another mode when the maximum correction capability of the current position is reached. The change-over to the erasure mode takes place in the same way as for k=4. The change-over to the single mode takes place when three bit errors occur within the same symbol in the erasure mode.

TABLE 1

```
        w           w              w                 w
0   0 0 0 0    0  0 0 0 0   0  a⁷  1 1 0 1   3  1 1 1 0   3
1   1 0 0 0    1  1 1 1 1   4  a⁸  1 0 1 0   2  0 0 1 1   2
a   0 1 0 0    1  1 0 0 1   2  a⁹  0 1 0 1   2  0 0 0 1   1
a²  0 0 1 0    1  1 1 0 0   2  a¹⁰ 1 1 1 0   3  1 0 1 0   2
```

TABLE 1-continued

```
a³  0 0 0 1   1  1 0 0 0   1  a¹¹ 0 1 1 1   3  1 1 0 1   3
a⁴  1 1 0 0   2  0 1 1 0   2  a¹² 1 1 1 1   4  0 0 1 0   1
a⁵  0 1 1 0   2  0 1 0 1   2  a¹³ 1 0 1 1   3  1 0 1 1   3
a⁶  0 0 1 1   2  0 1 0 0   1  a¹⁴ 1 0 0 1   2  0 1 1 1   3
    | | | |                          | | | |
    a⁰ a¹ a² a³                      a³ a⁶ a¹² a⁹
```

TABLE 2

|     | wt($c_0$) | wt($c_1$) | wt($c_2$) | weit prof |
|-----|-----------|-----------|-----------|-----------|
| 1   | 1         | 2         | 3         | (6, 3, 1) |
| a   | 1         | 2         | 3         | (6, 3, 1) |
| $a^2$ | 1       | 3         | 4         | (8, 4, 1) |
| $a^3$ | 1       | 2         | 3         | (6, 3, 1) |
| $a^4$ | 2       | 2         | 2         | (6, 4, 2) |
| $a^5$ | 2       | 3         | 1         | (6, 3, 1) |
| $a^6$ | 2       | 3         | 1         | (6, 3, 1) |
| $a^7$ | 3       | 4         | 1         | (8, 4, 1) |
| $a^8$ | 2       | 3         | 1         | (6, 3, 1) |
| $a^9$ | 2       | 2         | 2         | (6, 4, 2) |
| $a^{10}$ | 3    | 1         | 2         | (6, 3, 1) |
| $a^{11}$ | 3    | 1         | 2         | (6, 3, 1) |
| $a^{12}$ | 4    | 1         | 3         | (8, 4, 1) |
| $a^{13}$ | 3    | 1         | 2         | (6, 3, 1) |
| $a^{14}$ | 2    | 2         | 2         | (6, 4, 2) | min6  min3  min1

TABLE 3

| 15    | 12 | 7 | 11475 | 12 | 7 |
|-------|----|---|-------|----|---|
| 32767 | 12 | 7 | 399   | 12 | 6 |
| 8191  | 12 | 7 | 303   | 12 | 7 |
| 28671 | 12 | 7 | 4077  | 12 | 7 |
| 16381 | 12 | 7 | 3833  | 12 | 6 |
| 13    | 12 | 7 | 3505  | 10 | 5 |
| 12287 | 12 | 7 | 23927 | 12 | 7 |
| 15    | 12 | 7 | 5467  | 12 | 7 |
| 4095  | 12 | 7 | 10069 | 12 | 6 |
| 17    | 10 | 5 | 10069 | 12 | 6 |
| 30719 | 12 | 6 | 11571 | 12 | 7 |
| 33    | 12 | 7 | 5459  | 12 | 7 |
| 31743 | 12 | 7 | 7799  | 12 | 6 |
| 35    | 12 | 7 | 2387  | 12 | 7 |
| 24571 | 12 | 7 | 985   | 12 | 7 |
| 39    | 12 | 7 | 455   | 12 | 6 |
| 43    | 12 | 7 | 7295  | 12 | 7 |
| 16373 | 10 | 5 | 9719  | 12 | 6 |
| 45    | 12 | 7 | 1963  | 12 | 6 |
| 49    | 12 | 6 | 6709  | 10 | 5 |
| 15359 | 12 | 7 | 9901  | 12 | 7 |
| 11475 | 12 | 7 | 7315  | 10 | 5 |

TABLE 4

|   |       | $u_0$ | $u_1$ | $u_2$ | $v_0$ | $v_1$ | $v_2$ |
|---|-------|-------|-------|-------|-------|-------|-------|
| 2 | (110) |       | 1     |       | 1     |       |       |
|   | (101) | 1     |       |       |       |       | 1     |
|   | (011) |       |       | 1     |       | 1     |       |
| 3 | (210) |       | 2     |       | 1     |       |       |
|   | (120) |       | 1     |       | 2     |       |       |
|   | (201) | 1     |       |       |       |       | 2     |
|   | (102) | 2     |       |       |       |       | 1     |
|   | (021) |       |       | 2     |       | 1     |       |
|   | (012) |       |       | 1     |       | 2     |       |
| 4 | (310) |       | 3     |       | 1     |       |       |
|   | (130) |       | 1     |       | 3     |       |       |
|   | (301) | 1     |       |       |       |       | 3     |
|   | (103) | 3     |       |       |       |       | 1     |
|   | (031) |       |       | 3     |       | 1     |       |
|   | (013) |       |       | 1     |       | 3     |       |
|   | (220) |       | 2     |       | 2     |       |       |
|   | (202) | 2     |       |       |       |       | 2     |
|   | (022) |       |       | 2     |       | 2     |       |
|   | (410) |       | 4     |       | 1     |       |       |
|   | (140) |       | 1     |       | 4     |       |       |
|   | (401) | 1     |       |       |       |       | 4     |
|   | (104) | 4     |       |       |       |       | 1     |

TABLE 4-continued

| | $u_0$ | $u_1$ | $u_2$ | $v_0$ | $v_1$ | $v_2$ |
|---|---|---|---|---|---|---|
| (041) | | | 4 | 1 | | |
| (014) | | | 1 | 4 | | |
| (320) | | 3 | | 2 | | |
| (230) | | 2 | | 3 | | |
| (302) | 2 | | | | | 3 |
| (203) | 3 | | | | | 2 |
| (032) | | | 3 | | 2 | |
| (023) | | | 2 | | 3 | |

TABLE 5

$EM_0^{out} = RM^{in} p_{00} \overline{p_{10} p_{11}} + EM_0^{in} \overline{p_{01} q_{01}}$, $EM_1^{out} = RM^{in} p_{10} \overline{p_{20} p_{21}} + EM_1^{in} \overline{p_{11} q_{11}}$, $EM_2^{out} = RM^{in} p_{20} \overline{p_{00} p_{01}} + EM_2^{in} \overline{p_{21} q_{21}}$, $RM^{out} = RM^{in} (\overline{p_{00}} + p_{10} + p_{11})(\overline{p_{10}} + p_{20} + p_{21})(\overline{p_{20}} + p_{00} + p_{01})$.

$SM_0^{out} = SM_0^{in} + EM_1^{in} q_{11} + EM_2^{in} p_{21}$, $SM_1^{out} = SM_1^{in} + EN_0^{in} p_{01} + EM_2^{in} q_{21}$, $SM_2^{out} = SM_2^{in} + EM_0^{in} q_{01} + EM_1^{in} p_{11}$.

TABLE 6

| | | |
|---|---|---|
| (E00) | $p_{00}$ | $\underline{m}_1$ |
| (E10) | $q_{01}$ | $\underline{m}_2$ |
| (E01) | $p_{01}$ | $\underline{m}_1$ |
| (E11) | $T_0$ | $\underline{n}_{2j}$ |
| (E20) | $q_{02}$ | $\underline{m}_2$ |
| (E02) | $p_{02}$ | $\underline{m}_1$ |
| (0E0) | $p_{10}$ | $\underline{m}_2$ |
| (1E0) | $p_{11}$ | $\underline{m}_2$ |
| (0E1) | $q_{11}$ | $\underline{m}_0$ |
| (1E1) | $T_1$ | $\underline{n}_{0j}$ |
| (2E0) | $p_{12}$ | $\underline{m}_2$ |
| (0E2) | $q_{12}$ | $\underline{m}_0$ |
| (00E) | $p_{20}$ | $\underline{m}_0$ |
| (10E) | $q_{21}$ | $\underline{m}_1$ |
| (01E) | $p_{21}$ | $\underline{m}_0$ |
| (11E) | $T_2$ | $\underline{n}_{1j}$ |
| (20E) | $q_{22}$ | $\underline{m}_1$ |
| (02E) | $p_{22}$ | $\underline{m}_0$ |

TABLE 7

$\underline{m} = \underline{m}_0$: $SEL_0$: = $RM(p_{00}p_{10} + p_{20}\overline{p_{00}} + p_{21}q_{11} + p_{22}q_{11} + p_{21}q_{12})$
$+ EM_1(q_{11} + q_{12})$
$+ EM_2(p_{20} + p_{21} + p_{22})$
$+ SM_0$
$= 1$, $\underline{m} = \underline{m}_1$: $SEL_1$: = $RM(p_{00}\overline{p_{10}} + p_{01}q_{21} + p_{01}q_{22} + p_{02}q_{21})$
$+ EM_0(p_{00} + p_{01} + p_{02})$
$+ EM_2(q_{21} + q_{22})$
$+ SM_1$
$= 1$, $\underline{m} = \underline{m}_2$: $SEL_2$: = $RM(p_{10}\overline{p_{20}} + p_{11}q_{01} + p_{12}q_{01} + p_{11}q_{02})$
$+ EM_0(q_{01} + q_{02})$
$+ EM_2(p_{10} + p_{11} + p_{12})$
$+ SM_2$
$= 1$, $\underline{m} = \underline{n}_{0j}$: $SEL_{0j}$: = $EM_1 T_1 t_{0j} = 1; j = 0, 1, \ldots, 7$, $\underline{m} = \underline{n}_{1j}$: $SEL_{ij}$: = $(RM\ R\ par + EM_2 T_2)t_{1j} = 1$,
$j = 0, 1, \ldots, 7$, $\underline{m} = \underline{n}_{2j}$: $SEL_{2j}$: = $EM_0 T_0 t_{2j} = 1; j = 0, 1, \ldots, 7$.

TABLE 8

| A | B | C |
|---|---|---|
| (000) | $p_{00}\overline{p_{10}}$ | $\underline{m}_0$ |
| (X00) | $p_{00}\overline{p_{10}}$ | $\underline{m}_1$ |
| (0X0) | $p_{10}\overline{p_{20}}$ | $\underline{m}_2$ |
| (00X) | $p_{20}\overline{p_{00}}$ | $\underline{m}_0$ |
| (110) | $p_{11}q_{01}$ | $\underline{m}_2$ |
| (101) | $p_{01}q_{21}$ | $\underline{m}_1$ |
| (011) | $p_{21}q_{11}$ | $\underline{m}_0$ |
| (111) | $Y_0$: = $P$ $\overline{par}$ $B_0 B_1 B_2$ | $\underline{n}_{0j}$ |
| (210) | $p_{12}q_{01}$ | $\underline{m}_2$ |
| (120) | $p_{11}q_{02}$ | $\underline{m}_2$ |
| (201) | $p_{01}q_{22}$ | $\underline{m}_1$ |
| (102) | $p_{02}q_{21}$ | $\underline{m}_1$ |
| (021) | $p_{22}q_{11}$ | $\underline{m}_0$ |
| (012) | $p_{21}q_{12}$ | $\underline{m}_0$ |
| (310) | $p_{13}q_{01}$ | $\underline{m}_2$ |
| (130) | $p_{11}q_{03}$ | $\underline{m}_2$ |
| (301) | $p_{01}q_{23}$ | $\underline{m}_1$ |
| (103) | $p_{03}q_{21}$ | $\underline{m}_1$ |
| (031) | $p_{23}q_{11}$ | $\underline{m}_0$ |
| (013) | $p_{21}q_{13}$ | $\underline{m}_0$ |
| (220) | $p_{12}q_{02}$ | $\underline{m}_2$ |
| (202) | $p_{02}q_{22}$ | $\underline{m}_1$ |
| (022) | $p_{22}q_{12}$ | $\underline{m}_0$ |
| (211) | $Y_1$: = $P$ $\overline{par}$ $B_1 B_2$ | $\underline{n}_{1j}$ |
| (121) | $Y_2$: = $P$ $\overline{par}$ $B_0 B_2$ | $\underline{n}_{2j}$ |
| (112) | $Y_3$: = $P$ $\overline{par}$ $B_0 B_1$ | $\underline{n}_{0j}$ |

TABLE 8a

| A | B | C |
|---|---|---|
| (410) | $p_{14}q_{01}$ | $\underline{m}_2$ |
| (140) | $p_{11}q_{04}$ | $\underline{m}_2$ |
| (401) | $p_{01}q_{24}$ | $\underline{m}_1$ |
| (104) | $p_{04}q_{21}$ | $\underline{m}_1$ |
| (041) | $p_{24}q_{11}$ | $\underline{m}_0$ |
| (014) | $p_{21}q_{14}$ | $\underline{m}_0$ |
| (320) | $p_{13}q_{02}$ | $\underline{m}_2$ |
| (230) | $p_{12}q_{03}$ | $\underline{m}_2$ |
| (302) | $p_{02}q_{23}$ | $\underline{m}_1$ |
| (203) | $p_{03}q_{22}$ | $\underline{m}_1$ |
| (032) | $p_{23}q_{12}$ | $\underline{m}_0$ |
| (023) | $p_{22}q_{13}$ | $\underline{m}_0$ |
| (311) | $Y_4$: = $P$ par $A_{11}A_{22}\overline{B_1}\overline{B_2}$ | $\underline{n}_{1j}$ |
| (131) | $Y_5$: = $P$ par $A_{12}A_{20}\overline{B_0}\overline{B_2}$ | $\underline{n}_{2j}$ |
| (113) | $Y_6$: = $P$ par $A_{10}A_{21}\overline{B_0}\overline{B_1}$ | $\underline{n}_{0j}$ |
| (221) | $Y_7$: = $P$ par $\overline{B_0}\overline{B_1}B_2$ | $\underline{n}_{2j}$ |
| (212) | $Y_8$: = $P$ par $\overline{B_0}B_1\overline{B_2}$ | $\underline{n}_{1j}$ |
| (122) | $Y_9$: = $P$ par $B_0\overline{B_1}\overline{B_2}$ | $\underline{n}_{0j}$ |

$Y_{10}$: = $P$ $\overline{par}$ $\overline{(B_1 B_2 + B_0 B_2 + B_0 B_1)}$

TABLE 9

| A | B | C |
|---|---|---|
| (E00) | $p_{00}$ | $\underline{m}_1$ |
| (E10) | $q_{01}$ | $\underline{m}_2$ |
| (E01) | $p_{01}$ | $\underline{m}_1$ |
| (E11) | $Z_{00}$:=$T_0 A_{11} A_{22}$ | $\underline{n}_{1j}$ |
| (E20) | $q_{02}$ | $\underline{m}_2$ |
| (E02) | $p_{02}$ | $\underline{m}_1$ |
| (E30) | $q_{03}$ | $\underline{m}_2$ |
| (E03) | $p_{03}$ | $\underline{m}_1$ |
| (E21) | $Z_{01}$:=$T_0 A_{11} \overline{A_{22}}$ | $\underline{n}_{2j}$ |

TABLE 9-continued

| A | B | C |
|---|---|---|
| (E12) | $Z_{02} := T0A11\overline{A22}$ | $\underline{n}_{1j}$ |
| (0E0) | $p_{10}$ | $\underline{m}_2$ |
| (1E0) | $p_{11}$ | $\underline{m}_2$ |
| (0E1) | $q_{11}$ | $\underline{m}_0$ |
| (1E1) | $Z_{10} := T1A12A20$ | $\underline{n}_{0j}$ |
| (2E0) | $p_{12}$ | $\underline{m}_2$ |
| (0E2) | $q_{12}$ | $\underline{m}_0$ |
| (3E0) | $p_{13}$ | $\underline{m}_2$ |
| (0E3) | $q_{13}$ | $\underline{m}_0$ |
| (2E1) | $Z_{11} := T1A1\overline{2A20}$ | $\underline{n}_{2j}$ |
| (1E2) | $Z_{12} := T\overline{1A}12A20$ | $\underline{n}_{0j}$ |
| (00E) | $p_{20}$ | $\underline{m}_0$ |
| (10E) | $q_{21}$ | $\underline{m}_1$ |
| (01E) | $p_{21}$ | $\underline{m}_0$ |
| (11E) | $Z_{20} := T2A10A21$ | $\underline{n}_{0j}$ |
| (20E) | $q_{22}$ | $\underline{m}_1$ |
| (02E) | $p_{22}$ | $\underline{m}_0$ |
| (30E) | $q_{23}$ | $\underline{m}_1$ |
| (03E) | $p_{23}$ | $\underline{m}_0$ |
| (21E) | $Z_{21} := T2\overline{A10}A21$ | $\underline{n}_{1j}$ |
| (12E) | $Z_{22} := T2A1\overline{0A21}$ | $\underline{n}_{0j}$ |

TABLE 10

$\overline{P} := (p_{00}p_{10} + p_{00}\overline{p}_{10} + p_{10}\overline{p}_{20} + p_{20}\overline{p}_{00} + p_{11}q_{01} + p_{01}q_{21} +$ $p_{21}q_{11} + p_{12}q_{01} + p_{11}q_{02} + p_{01}q_{22} + p_{02}q_{21} + p_{22}q_{11} +$
$p_{21}q_{11} + p_{13}q_{01} + p_{11}q_{03} + p_{01}q_{23} + p_{03}q_{21} + p_{23}q_{11} +$
$p_{21}q_{13} + p_{12}q_{02} + p_{02}q_{22} + p_{22}q_{12} + p_{14}q_{01} + p_{11}q_{04} +$
$p_{01}q_{24} + p_{04}q_{21} + p_{24}q_{11} + p_{21}q_{14} + p_{13}q_{02} + p_{12}q_{03} +$
$p_{02}q_{23} + p_{03}q_{22} + p_{23}q_{12} + p_{22}q_{13}).$

TABLE 11

$\underline{m} = \underline{m}_0 : SEL_0 := RM(p_{00}p_{10} + p_{20}\overline{p_{00}} + p_{21}q_{11} + p_{22}q_{11} +$ $p_{21}q_{12} + p_{23}q_{11} + p_{21}q_{13} + p_{22}q_{12} + p_{24}q_{11} +$
$p_{21}q_{14} + p_{23}q_{12} + p_{22}q_{13})$
$+ EM_1(q_{11} + q_{12} + q_{13})$
$+ EM_2(p_{20} + p_{21} + p_{22} + p_{23})$
$+ SM_0$
$= 1,$ $\underline{m} = \underline{m}_1 : SEL_1 := RM(p_{00}\overline{p_{10}} + p_{01}q_{21} + p_{01}q_{22} + p_{02}q_{21} +$ $p_{01}q_{23} + p_{03}q_{21} + p_{02}q_{22} + p_{01}q_{24} + p_{04}q_{21} +$
$p_{02}q_{23} + p_{03}q_{22})$
$+ EM_0(p_{00} + p_{01} + p_{02} + p_{03})$
$+ EM_2(q_{21} + q_{22} + p_{23})$
$+ SM_1$
$= 1,$ $\underline{m} = \underline{m}_2 : SEL_2 := RM(p_{10}\overline{p_{20}} + p_{11}q_{01} + p_{12}q_{01} + p_{11}q_{02} +$ $p_{13}q_{01} + p_{11}q_{03} + p_{12}q_{02} + p_{14}q_{01} + p_{11}q_{04} +$
$p_{13}q_{02} + p_{12}q_{03})$
$+ EM_0(q_{01} + q_{02} + q_{03})$
$+ EM_1(p_{10} + p_{11} + p_{12} + p_{13})$
$+ SM_2$
$= 1,$ $\underline{m} = \underline{n}_{1j}; SEL_{0j} := RM(Y_0 + Y_3 + Y_6 + Y_9) + EM_1(Z_{00} + Z_{12}) +$
$EM_2(Z_{20} + Z_{22}) = 1 \ j = 0, 1, \ldots, 15,$ $\underline{m} = \underline{n}_{1j}; SEL_{1j} := RM(Y_1 + Y_4 + Y_8) + EM_0(Z_{00}Z_{02}) +$
$EM_2Z_{21} = 1 \ j = 0, 1, \ldots, 15,$

TABLE 11-continued $\underline{m} = \underline{n}_{2j}; SEL_{2j} := RM(Y_2 + Y_5 + Y_7) + EM_0Z_{01} +$
$EM_1Z_{11} = 1 \ j = 0, 1, \ldots, 15,$

What is claimed is:

1. A three-module data processing system for processing in each module identical data symbols of at least eight bits, each module comprising an output encoder (26, 28, 30) for multiplying a result symbol by a different regular matrix to an intermediate code symbol and each intermediate code symbol by a common regular matrix and by a permutation matrix to yield a code symbol, corresponding code symbols based on said identical data symbols constituting a code with minimum distance profile of at least (8, 4, 1), said data processing system also comprising:
   an interconnection network fed by said output encoders (68, 70, 72);
   in each module an input decoder fed by said network for receiving three code symbols, said decoders comprising reconverters for compensating for said encodings; and thereupon reconstituting said data symbol;
   a mode register (110) for controlling said input decoders
   for correcting in a normal mode either one single disturbed code symbol or, alternatively up to three disturbed code bits in more than one different symbol;
   in each of three different erase modes ignoring one associated code symbol and additionally correcting one arbitrary disturbed code bit, or alternatively detecting up to two arbitrary disturbed code bits.

2. A data processing system as claimed in claim 1, wherein said minimum distance profile is at least (8, 5, 1) and wherein said mode register controls said input decoders for correcting in a normal mode either one single disturbed code symbol, or alternatively for correcting up to three disturbed code bits in more than one different symbol, or alternatively detecting up to four disturbed code bits in more than one different symbol; and in each of three different erase modes ignoring one associated code symbol and additionally correcting up to two arbitrary disturbed code bits.

3. A data processing system as claimed in claim 1 or 2, wherein for a symbol length of at least sixteen bits said minimum distance profile is at least (11, 7, 1) and wherein said mode register in said normal mode controls correction of either one single disturbed code symbol or, alternatively up to five different code bits in more than one different symbol.

4. A three-module data processing system for processing in each module identical data symbols of at least four bits, each module comprising an output encoder (26, 28, 30) for multiplying a result symbol by a different regular matrix to an intermediate code symbol and each intermediate code symbol by a common regular matrix and by a permutation matrix to yield a four-bit code symbol, corresponding code symbols based on said identical data symbols constituting a code word of a code with a minimum distance profile (6, 3, 1), said data processing system also comprising:
   an interconnection network fed by said output encoders (68, 70, 72);
   in each module an input decoder fed by said network for receiving three code symbols, said decoders comprising reconverters for compensating for said encodings, and thereupon reconstituting said data symbol;

a mode register (110) for controlling said input decoders for correcting in a normal mode either one single disturbed code symbol or, alternatively up to two disturbed code bits in different symbols;

in each of three different erase modes ignoring one associated code symbol and additionally correcting one arbitrary disturbed code bit.

5. A data processing system as claimed in any one of the claims 4, 1 or 2, characterized in that there are provided a gating element (112, 114, 116) and a detector (108) for a non-disturbed symbol in order to render, using an output signal of the detector, the gating element conductive for a non-disturbed symbol for presentation thereof to the processing means.

6. A data processing system as claimed in claim 5, further comprising:

detection means for detecting a correctable error configuration in the absence of a non-disturbed symbol;

an emulation device for emulating a corrected symbol under control of a least-disturbed symbol; and means for controlling said gating means for transmitting said emulated symbol under control of a signal from said detection means.

* * * * *